US012597930B2

(12) United States Patent
Singh et al.

(10) Patent No.: US 12,597,930 B2
(45) Date of Patent: Apr. 7, 2026

(54) MULTI-MODE LOOK-UP TABLE WITH FLEXIBLE ROUTING FOR PROGRAMMABLE LOGIC DEVICE SYSTEMS AND METHODS

(71) Applicant: Lattice Semiconductor Corporation, Hillsboro, OR (US)

(72) Inventors: Satwant Singh, Fremont, CA (US); Patrick J. Crotty, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 41 days.

(21) Appl. No.: 18/665,364

(22) Filed: May 15, 2024

(65) Prior Publication Data

US 2025/0357929 A1 Nov. 20, 2025

(51) Int. Cl.
*H03K 19/173* (2006.01)
*H03K 19/17728* (2020.01)

(52) U.S. Cl.
CPC ... *H03K 19/1737* (2013.01); *H03K 19/17728* (2013.01)

(58) Field of Classification Search
None
See application file for complete search history.

(56) References Cited

U.S. PATENT DOCUMENTS

| | | | |
|---|---|---|---|
| 7,394,387 B2 * | 7/2008 | Noonchester | B62B 5/0023 340/673 |
| 2003/0001615 A1 * | 1/2003 | Sueyoshi | H03K 19/17748 326/41 |
| 2016/0315619 A1 * | 10/2016 | Fan | H03K 19/1732 |
| 2022/0247413 A1 * | 8/2022 | Gort | H03K 19/17728 |
| 2023/0216503 A1 * | 7/2023 | Singh | H03K 19/17728 326/38 |

OTHER PUBLICATIONS

"Intel Agilex® 7 Logic Array Blocks and Adaptive Logic Modules User Guide," Mar. 27, 2023, Intel.
"Intel® Stratix® 10 Logic Array Blocks and Adaptive Logic Modules User Guide," Mar. 27, 2022, Intel.
"UltraScale Architecture Configurable Logic Block User Guide," Feb. 28, 2017, XILINX.
"Versal ACAP Configurable Logic Block Architecture Manual," Jul. 16, 2020, XILINX.

* cited by examiner

*Primary Examiner* — Anh Q Tran
(74) *Attorney, Agent, or Firm* — Haynes and Boone, LLP

(57) ABSTRACT

Various techniques are provided for implementing one or more multi-mode look-up tables (LUTs) in programmable logic devices (PLDs). In one example, a PLD includes a multi-mode LUT. The comprising: a plurality of input nodes configured to receive a plurality of input signals; wherein the multi-mode LUT is configurable to selectively operate in a first mode as a single LUT or in a second mode as dual LUTs and generate a plurality of output signals in accordance with one or more logic functions in response to the input signals; and a plurality of output nodes configured to provide the plurality of output signals simultaneously to routing resources of the PLD.

20 Claims, 7 Drawing Sheets

300

| | |
|---|---|
| RECEIVE DESIGN | ~310 |
| SYNTHESIZE DESIGN INTO COMPONENTS | ~320 |
| MAP COMPONENTS TO PLD | ~330 |
| PERFORM PLACEMENT OF COMPONENTS | ~340 |
| ROUTE CONNECTIONS | ~350 |
| GENERATE CONFIGURATION DATA | ~360 |
| PROGAM PLD | ~370 |

202

202

800

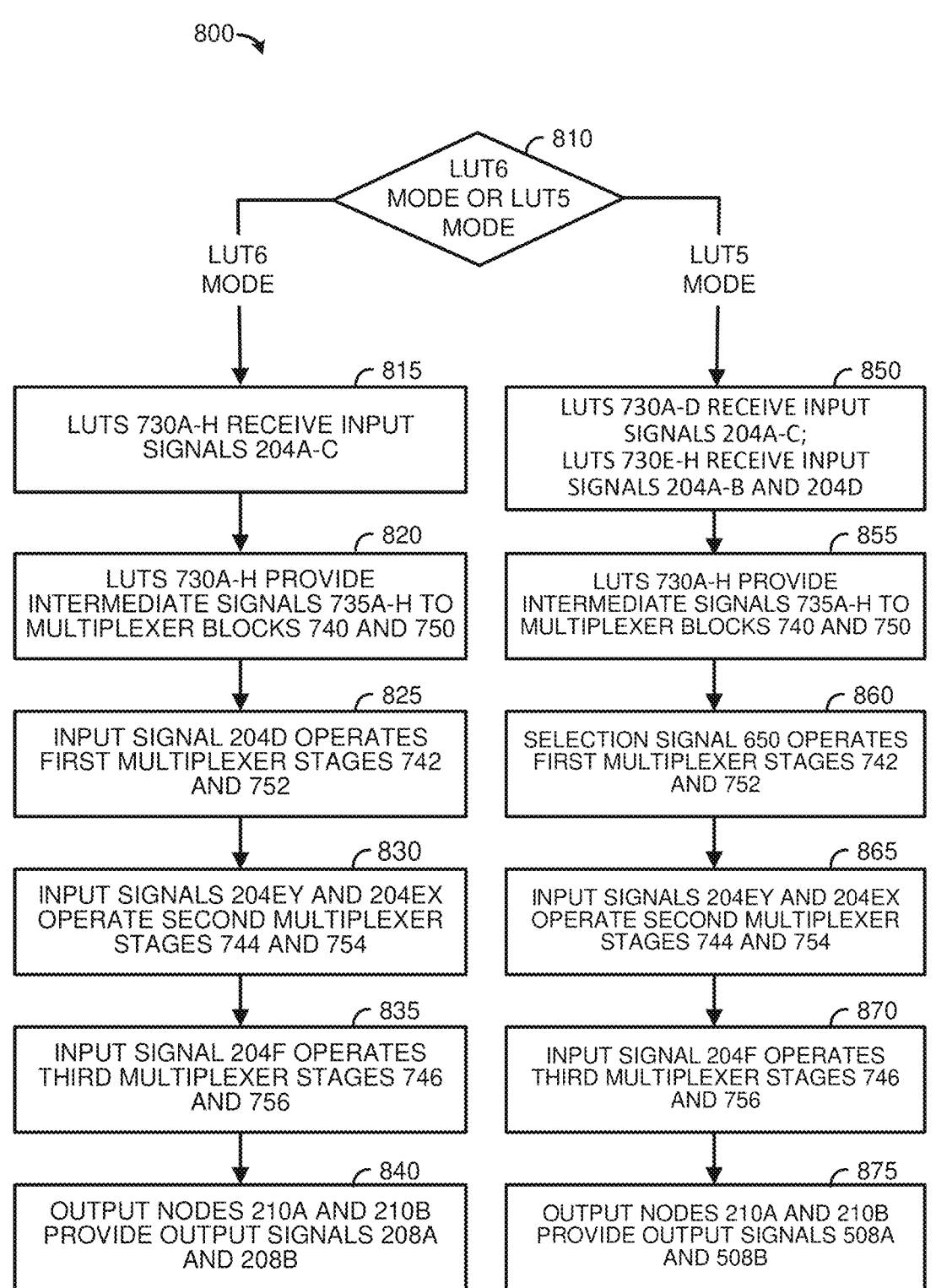

810
LUT6 MODE OR LUT5 MODE

LUT6 MODE

815
LUTS 730A-H RECEIVE INPUT SIGNALS 204A-C

820
LUTS 730A-H PROVIDE INTERMEDIATE SIGNALS 735A-H TO MULTIPLEXER BLOCKS 740 AND 750

825
INPUT SIGNAL 204D OPERATES FIRST MULTIPLEXER STAGES 742 AND 752

830
INPUT SIGNALS 204EY AND 204EX OPERATE SECOND MULTIPLEXER STAGES 744 AND 754

835
INPUT SIGNAL 204F OPERATES THIRD MULTIPLEXER STAGES 746 AND 756

840
OUTPUT NODES 210A AND 210B PROVIDE OUTPUT SIGNALS 208A AND 208B

LUT5 MODE

850
LUTS 730A-D RECEIVE INPUT SIGNALS 204A-C; LUTS 730E-H RECEIVE INPUT SIGNALS 204A-B AND 204D

855
LUTS 730A-H PROVIDE INTERMEDIATE SIGNALS 735A-H TO MULTIPLEXER BLOCKS 740 AND 750

860
SELECTION SIGNAL 650 OPERATES FIRST MULTIPLEXER STAGES 742 AND 752

865
INPUT SIGNALS 204EY AND 204EX OPERATE SECOND MULTIPLEXER STAGES 744 AND 754

870
INPUT SIGNAL 204F OPERATES THIRD MULTIPLEXER STAGES 746 AND 756

875
OUTPUT NODES 210A AND 210B PROVIDE OUTPUT SIGNALS 508A AND 508B

FIG. 8

MULTI-MODE LOOK-UP TABLE WITH FLEXIBLE ROUTING FOR PROGRAMMABLE LOGIC DEVICE SYSTEMS AND METHODS

TECHNICAL FIELD

The present invention relates generally to programmable logic devices and, more particularly, to the implementation of look-up tables in such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with user designs to implement desired functionality. Typically, the user designs are synthesized and mapped into configurable resources (e.g., programmable logic gates, look-up tables (LUTs), embedded hardware, or other types of resources) and interconnections available in particular PLDs.

For example, PLDs may include LUTs that are capable of providing one or more output signals in response to various numbers of input signals. However, as the number of input signals increases, the overall complexity and propagation delays (e.g., latency from input signals to output signals) of the LUTs also generally increases.

In some cases, a large LUT (e.g., capable of responding to a large number of input signals) may be used to implement multiple small LUTs (e.g., each capable of responding to reduced numbers of input signals). However, conventional approaches to such implementations have significant drawbacks. In particular, the small LUTs may exhibit the larger propagation delay associated with the large LUT rather than a lesser propagation delay that would be exhibited by dedicated small LUTs.

SUMMARY

Various techniques are provided for implementing one or more multi-mode LUTs in PLDs. In various embodiments, a multi-mode LUT may be selectively operated as a single LUT or a plurality of LUTs to provide flexible implementations for PLD designs. For example, when the multi-mode LUT is operated as a single LUT, it may provide swappable output nodes that may be directly connected to routing resources of the PLD. When the multi-mode LUT is operated as a plurality of LUTs, it may provide different output signals from the LUTs to the routing resources simultaneously and without requiring an additional multiplexer stage to switch between the different output signals. As a result, the multi-mode LUT may provide increased flexibility and reduced propagation delay over conventional LUTs.

In one example, a PLD includes a multi-mode LUT comprising: a plurality of input nodes configured to receive a plurality of input signals; wherein the multi-mode LUT is configurable to selectively operate in a first mode as a single LUT or in a second mode as dual LUTs and generate a plurality of output signals in accordance with one or more logic functions in response to the input signals; and a plurality of output nodes configured to provide the plurality of output signals simultaneously to routing resources of the PLD.

In another example, a method includes receiving a plurality of input signals at a plurality of input nodes of a multi-mode LUT of a PLD; selectively operating the multi-mode LUT in a first mode as a single LUT or a second mode as dual LUTs to generate output signals in accordance with one or more logic functions in response to the input signals; and providing the output signals from corresponding output nodes of the PLD simultaneously to routing resources of the PLD.

BRIEF DESCRIPTION OF THE DRAWINGS

FIG. 8 illustrates a process of operating a LUT in accordance with an embodiment of the disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with embodiments set forth herein, PLDs are provided with multi-mode look-up tables (LUTs) that exhibit reduced propagation delays. For example, in some embodiments, a large six input LUT (e.g., LUT6) may be fractured (e.g., split) into two smaller LUTs having five or fewer inputs (e.g., generally referred to herein as LUT5s and LUT5 mode) that may be simultaneously operated and each having reduced propagation delay in comparison with conventional fractured LUT implementations. In particular, a LUT6 of the present disclosure may include parallel decoding multiplexer blocks that remove at least one series multiplexer stage in comparison with conventional fracturable LUTs, thereby permitting the LUT6 to directly and simultaneously drive routing resources (e.g., the LUT6 may be connected to routing resources without the additional series multiplexer stage). This effectively reduces the number of multiplexer stages used in comparison with conventional fracturable LUTs. As a result, when the LUT6 is used as two LUT5s, it will exhibit reduced propagation delay, thus increasing the PLD's overall speed of operation.

In some embodiments, the two LUT5s implemented by the larger LUT may include one or more shared input signals that exhibit different propagation delays through the LUT5s. In particular, at least one shared input signal may exhibit a reduced propagation delay in relation to other shared input signals as a result of the reduced number of series multiplexers. In contrast, conventional fracturable LUTs generally exhibit the same large propagation delays on all shared input signals which limits their achievable performance.

In some embodiments, a LUT6 implemented with parallel decoding multiplier circuits in accordance with the present disclosure may provide two output nodes that are swappable with each other. This provides flexible routing implementations for the LUT6 without the need for an additional series multiplexer to select between the output nodes that would otherwise increase propagation delay in conventional implementations.

Figure 1:
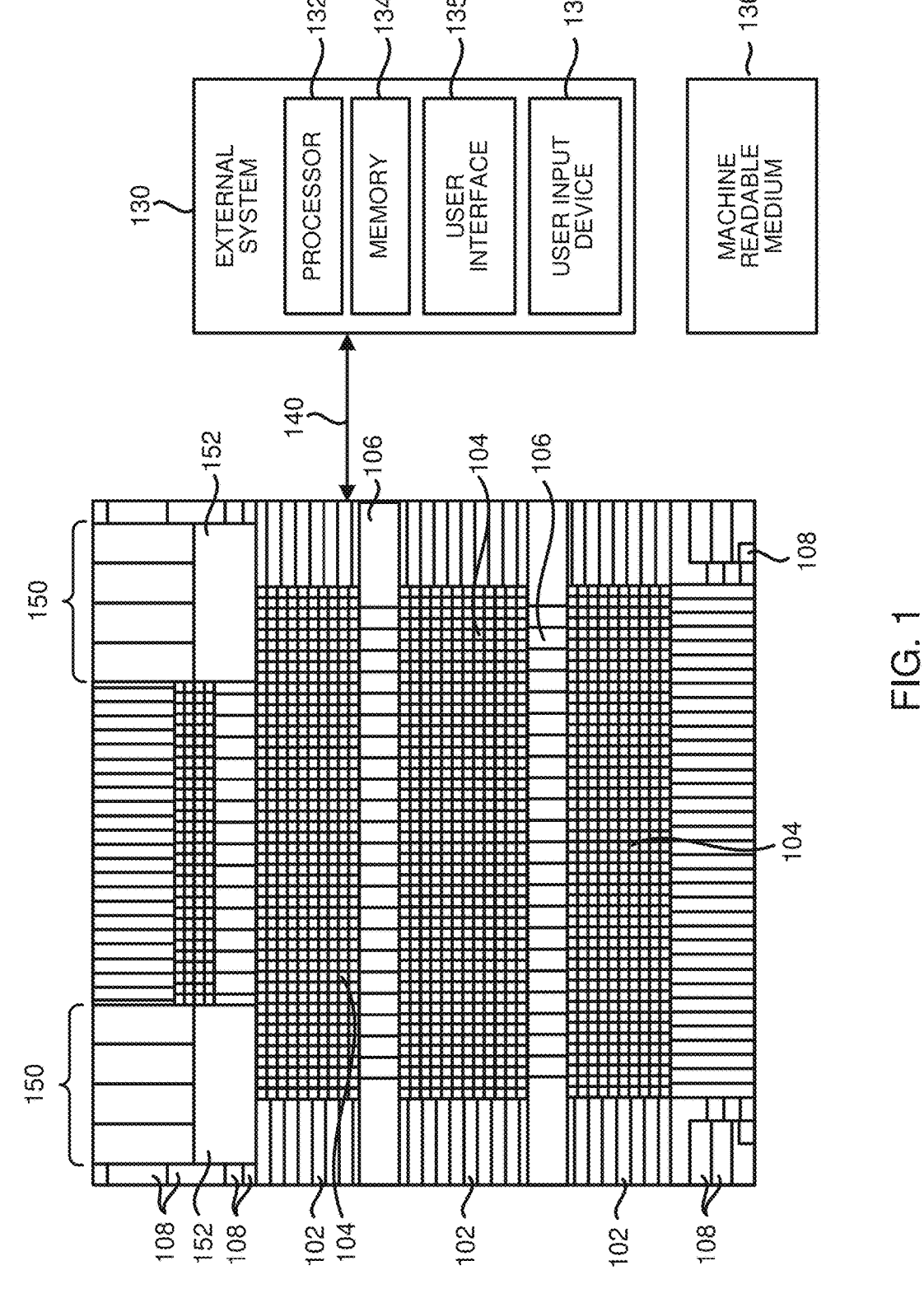
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected). Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
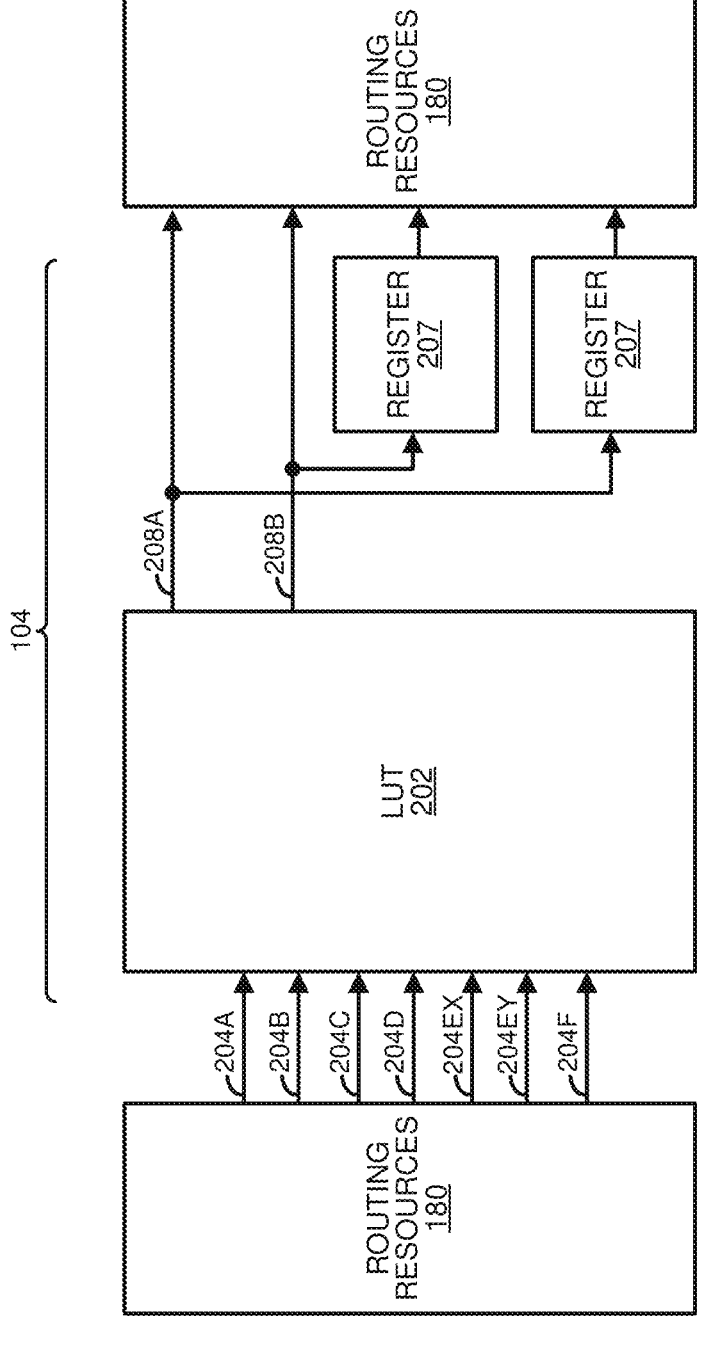
FIG. 2 illustrates a block diagram of a programmable logic block for a PLD in accordance with an embodiment of the disclosure.

FIG. 2 illustrates a block diagram of a logic block 104 of PLD 100 in accordance with an embodiment of the disclosure. As shown, logic block 104 includes a look-up table 202 and one or more registers 207 (e.g., flip-flops or latches). In some embodiments, additional components may be included such as mode logic, configurable input and/or output logic, and/or other components.

As shown, logic block 104 receives input signals 204A-F from other components of PLD 100 through routing resources 180 and provides output signals 208A-B to routing resources 180 in response thereto. In this regard, LUT 202 may be configured (e.g., by storing appropriate values in memories of LUT 202) to implement logic functions to associate various values of input signals 204A-F with various values of output signals 208A-B.

In various embodiments, output signals 208A-B (and also output signals 508A-B discussed herein with regard to a LUT5 mode of operation) may be provided directly and simultaneously to routing resources 180 (e.g., for rapid utilization by other components of PLD 100 that are connected to routing resources 180) and/or held by registers 207 before being provided to routing resources 180 during a subsequent clock cycle (e.g., for clocked sequential operation).

In this example, LUT 202 is a LUT6 that accepts input signals 204A-F. As further illustrated and discussed herein with regard to FIG. 4, input signal 204EX is associated with output signal 208B. Similarly, input signal 204EY is associated with output signal 208A.

As a result, LUT 202 provides a LUT6 mode with output signal 208A provided in response to input signals 204A-D, 204EY, and 204F, and output signal 208B provided in response to input signals 204A-D, 204EX, and 204F. Accordingly, LUT 202 may be programmed by configuration data for PLD 100 to implement any appropriate logic operation having six inputs or less. In addition, LUT 202 may be fracturable into two LUT5s and operated in a LUT5 mode as further discussed herein.

Figure 3:
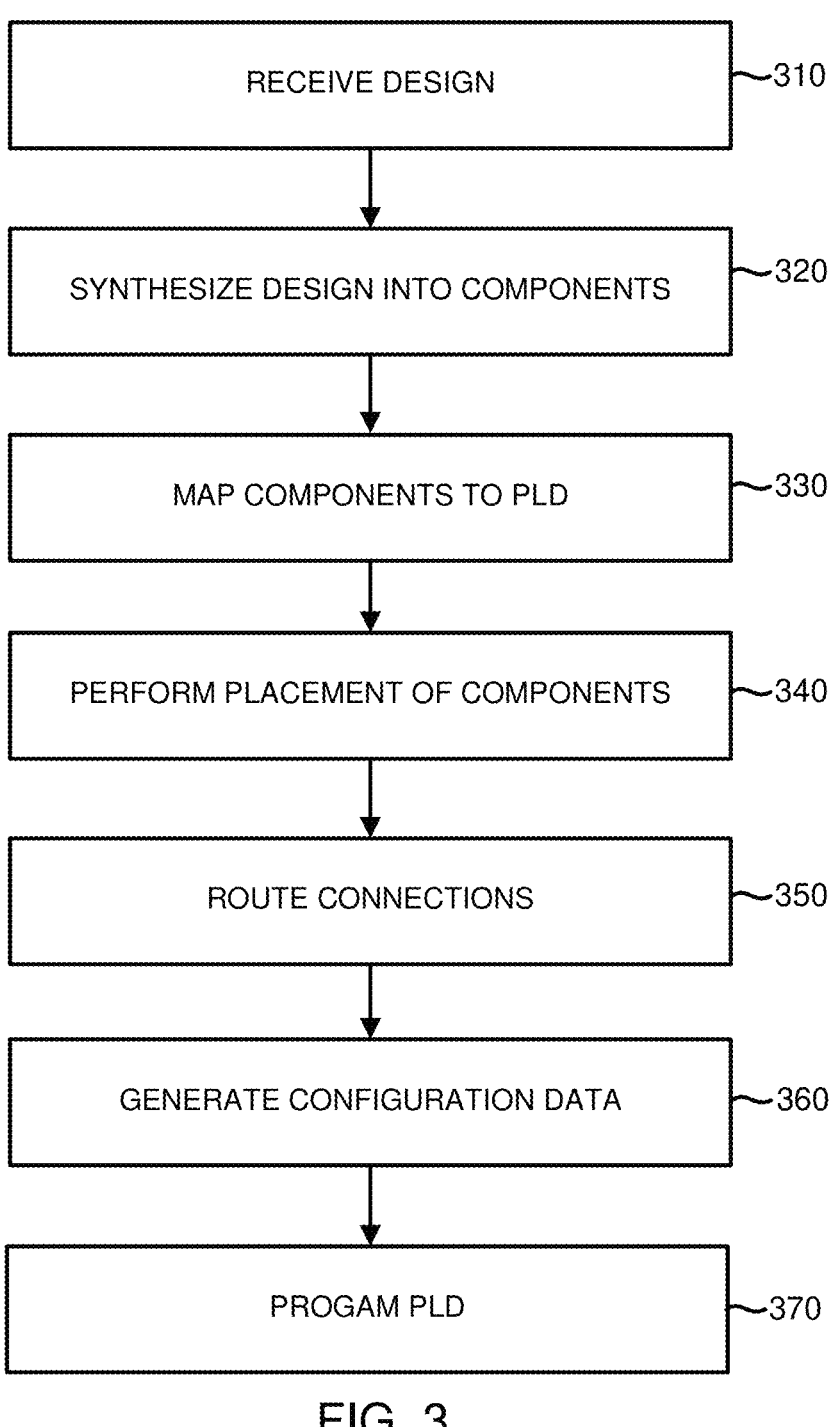
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running a PLD configuration application such as Lattice Radiant Software, Lattice Diamond Software, and/or others as appropriate to configure PLD 100. In some embodiments, the various files and information referenced in FIG. 3 may be stored, for example, in one or more databases and/or other data structures in memory 134, machine readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., particular logic blocks 104, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In some embodiments, the mapping performed in operation 330 may include identifying types of logic blocks 104 with appropriately sized LUTs for implementing logic functions of the user design. This may include identifying types of logic blocks 104 with LUTs that can accommodate the numbers of input signals associated with a logic function, including the possible fracturing of LUTs to implement two logic functions where appropriate. For example, operation 330 may include assigning a single logic function to a type of logic block 104 that includes LUT 202 for operation as a single LUT6 in a LUT6 mode or assigning two logic functions to a type of logic block 104 that includes LUT 202 for fractured operation as two LUT5s in a LUT5 mode. In some embodiments, operation 330 may include selecting a value (e.g., a logic high or a logic low) for selection signal 650 further discussed herein to configure LUT 202 for LUT6 mode or LUT5 mode.

In operation 340, system 130 performs a placement process to assign the mapped netlist components to particular physical components residing at specific physical locations of the PLD 100 (e.g., assigned to particular logic blocks 104, routing resources 180, and/or other physical components of PLD 100), and thus determine a layout for the PLD 100. In some embodiments, the placement may be performed on one or more previously-stored NCD files, with the placement results stored as another physical design file.

In some embodiments, the placement performed in operation 340 may include mapping the types of logic blocks 104 identified in operation 330 to particular physical logic blocks 104 residing at specific locations within PLD 100. For example, this may include assigning the single or two logic functions discussed above (e.g., associated with a type of logic block 104 that includes LUT 202) to a particular logic block 104 that includes LUT 202 for implementing such functions.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for PLD 100 (e.g., by combining the results of the corresponding previous operations). In operation 360, system 130 generates configuration data for the synthesized, mapped, placed, and routed user design. In operation 370, system 130 configures PLD 100 with the configuration data by, for example, loading a configuration data bitstream into PLD 100 over connection 140.

Figure 4:
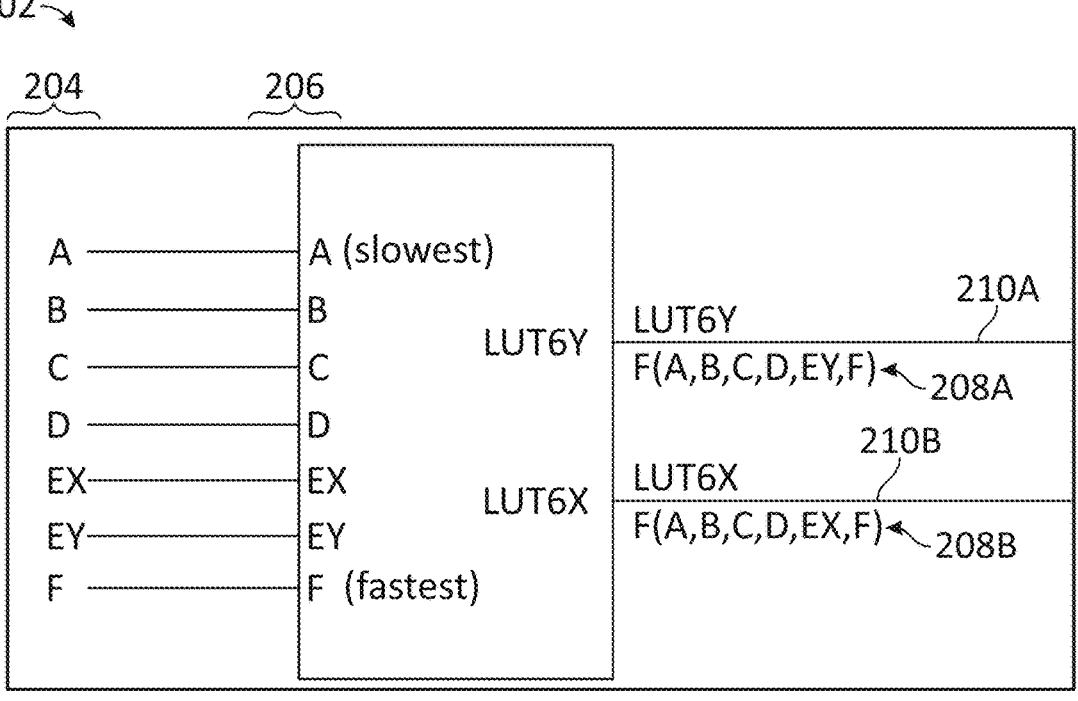
FIG. 4 illustrates a block diagram of a look-up table (LUT) in accordance with an embodiment of the disclosure.

FIG. 4 illustrates a block diagram of LUT 202 configured for a LUT6 mode in accordance with an embodiment of the disclosure. As shown, LUT 202 receives input signals 204A-F at input nodes 206A-F and provides output signals 208A-B (e.g., labeled LUT6Y and LUT6X) at output nodes 210A-B in response thereto. Input nodes 206A-F illustrated in FIG. 4 are higher level abstractions of input nodes 206AX-FX and 206AY-FY further discussed herein.

As shown in FIG. 4, output signal 208A (e.g., LUT6Y) is a function of input signals 204A-D, 204EY, and 204F). Output signal 208B (e.g., LUT6X) is a function of input signals 204A-D, 204EX, and 204F).

As a result, output nodes 210A and 210B are swappable with each other by using the appropriate input signal 204EX or 204EY and input node 206EX or 206EY. This permits LUT 202 to be operated without an additional multiplexer stage between output nodes 210A-B and routing resources 180 (e.g., output nodes 210A-B may be directly connected to routing resources as illustrated in FIG. 2). As discussed, this causes LUT 202 to exhibit reduced propagation delay and therefore reduced latency and increased operational speed for PLD 100.

As further identified in FIG. 4, different input signals 204 exhibit different propagation delays through LUT 202. For example, input signal 204F propagates the fastest through LUT 202. In this regard, changing values of input signal 204F will affect the values of output signals 208A-B faster than the remaining input signals 204 (e.g., input signal 204F will exhibit the smallest propagation delay).

In contrast, input signal 204A propagates the slowest through LUT 202. In this regard, changing values of input signal 204A will affect the values of output signals 208A-B slower than the remaining input signals 204 (e.g., input signal 204A will exhibit the largest propagation delay).

Figure 5:
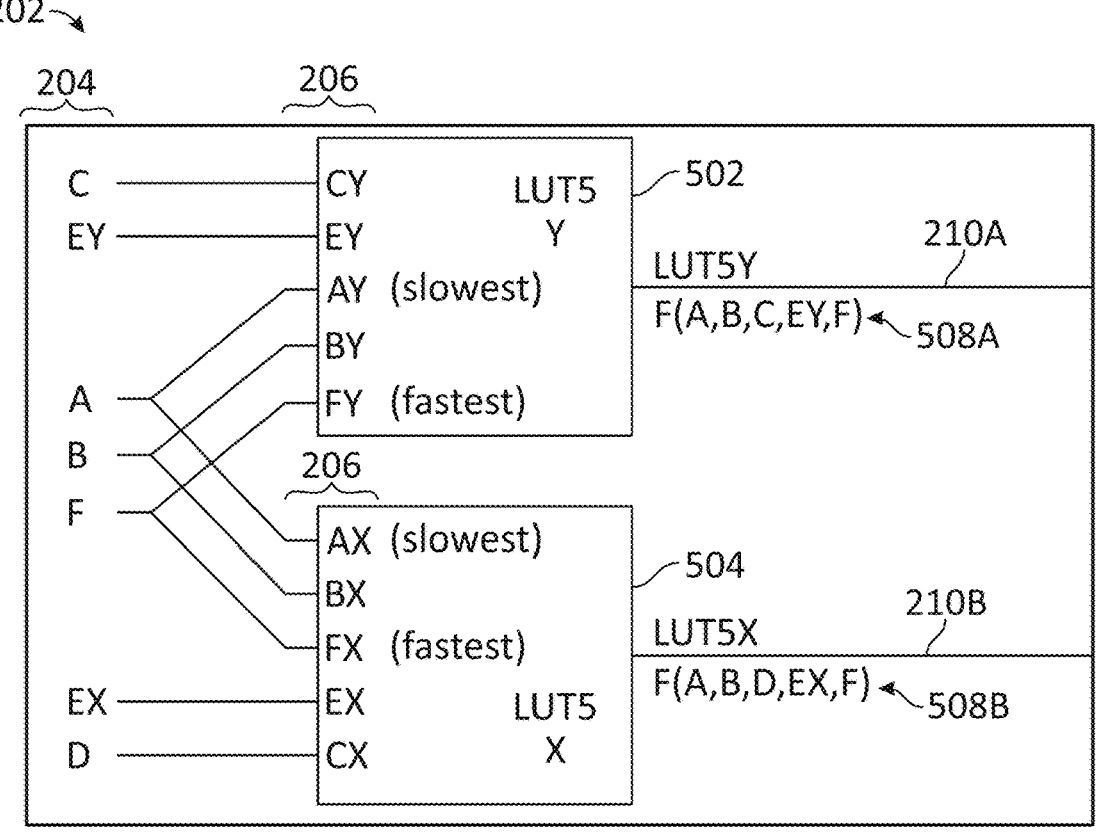
FIG. 5 illustrates a block diagram of a LUT configured to implement two smaller look-up tables in accordance with an embodiment of the disclosure.

FIG. 5 illustrates a block diagram of LUT 202 configured to implement two smaller LUTs 502 and 504 (e.g., labeled LUT5Y and LUT5X) in accordance with an embodiment of the disclosure. In this regard, the previous LUT6 mode of LUT 202 has been changed to provide LUT5 mode by fracturing LUT6 into LUTs 502 and 504. It will be appreciated that LUTs 502 and 504 are not physically different from LUT 202 but rather are implemented by operating LUT 202 in a LUT5 mode rather than a LUT6 mode.

In this configuration, LUT 202 receives input signals 204A-F at various input nodes 206AX-CX, 206EX-FX, 206AY-CY, and 206EY-FY, and provides output signals 508A-B (e.g., the output signals for LUT5 mode) at output nodes 210A-B. This change in output signal labeling reflects the new logic functions implemented by the LUT5 operational mode of LUT 202 (e.g., providing LUTs 502 and 504) in comparison to output signals 208A-B provided by the logic function implemented by the LUT6 operational mode of LUT 202.

As shown, output signal 508A (e.g., LUT5Y) is a function of input signals 204A-C, 204EY, and 204F). Output signal 508B (e.g., LUT5X) is a function of input signals 204A-B,

204D, 204EX, and 204F). In this regard, input signals 204A-B and 204F are shared between LUTs 510 and 520. As such, output signals 508A-B are both dependent on the values of input signals 204A-B and 204F.

Similar to the LUT6 configuration of LUT 202 in FIG. 4, the LUT5 configuration of LUT 202 in FIG. 5 (e.g., providing LUTs 502 and 504) may also be operated without an additional multiplexer stage between output nodes 210A-B and routing resources 180 and exhibits reduced propagation delay and therefore reduced latency and increased operational speed for PLD 100.

As further shown in FIG. 5, different input signals 204 continue to exhibit different propagation delays through LUT 202 when configured as LUTs 502 and 504 as similarly discussed with regard to FIG. 4. For example, input signal 204F feeds input nodes 206FX and 206FY, and propagates the fastest through LUTs 502 and 504. Accordingly, changing values of input signal 204F will affect the values of output signals 508A-B faster than the remaining input signals 204 (e.g., input signal 204F will exhibit the smallest propagation delay).

In contrast, input signal 204A feeds input nodes 206AX and 206AY, and propagates the slowest through LUTs 502 and 504. Accordingly, changing values of input signal 204A will affect the values of output signals 508A-B slower than the remaining input signals 204 (e.g., input signal 204A will exhibit the largest propagation delay).

Figure 6:
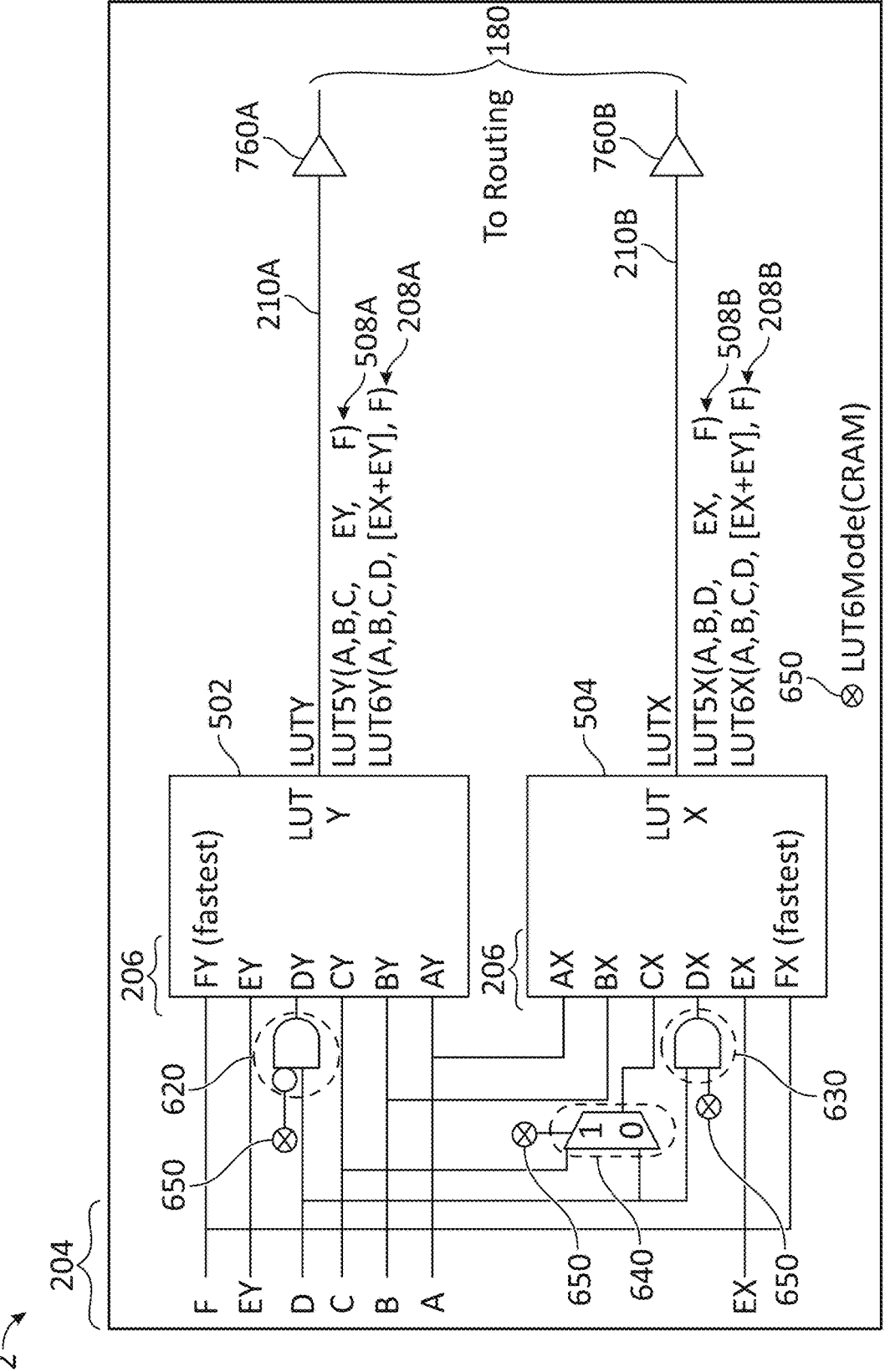
FIG. 6 illustrates a block diagram of a LUT with additional logic circuits illustrated in accordance with an embodiment of the disclosure.

FIG. 6 illustrates a block diagram of LUT 202 with additional input circuits 610 illustrated in accordance with an embodiment of the disclosure. As discussed, LUT 202 may be configured to operate in a LUT6 mode or as two LUTs 502 and 504 in a LUT5 mode. Input nodes 206A-D and 206F in FIG. 4 are a higher level abstraction of input nodes 206AX-DX/206AY-DY and 206FX/206FY, respectively, in FIG. 6.

As also shown in FIG. 6, output signals 208A-B provided at output nodes 210A-B are identified with their associated logic functions for LUT6 mode. In LUT6 mode, output signals 208A (labeled LUT6Y) and 208B (labeled LUT6X) may provide the same output signal at output nodes 210A-B, thereby permitting output nodes 210A-B to be swappable with each other from a logical perspective. As discussed, this provides flexibility in routing output signals 208A-B to various routing resources 180 (e.g., illustrated in FIG. 2). Output signals 508A-B provided at output nodes 210A-B are identified with their associated logic functions for LUT5 mode.

Various logic circuits may be used to selectively adjust the operation of LUT 202 to operate in a LUT6 mode or as two LUTs 502 and 504 in a LUT5 mode. For example, logic circuits 620, 630, and 640 are responsive to a selection signal 650 (e.g., also referred to as CRAM and provided by a configuration bit stored in memory 106) to selectively connect various input signals 204 to various input nodes 206.

For example, LUT 202 may operate in a LUT6 mode when selection signal 650 is set to a logic high value (e.g., 1), or in a LUT5 mode (e.g., operating as LUTs 502 and 504) when selection signal 650 is set to a logic low value (e.g., 0).

When selection signal 650 is set to a logic high value for LUT6 mode, logic circuit 620 passes input signal 204D to input node 206DY, logic circuit 630 passes input signal 204D to input node 206DX (e.g., AND gate of logic circuit 630 is enabled by selection signal 650), and logic circuit 640 passes input signal 204C to input node 206CX. This permits input signals 204A-D, 204EY, and 204F to be processed by LUT 202 to provide output signal 208A in response to such signals. This also permits input signals 204A-D, 204EX, and 204F to be processed by LUT 202 to provide output signal 208B in response to such signals.

When selection signal 650 is set to a logic low value for LUT5 mode, logic circuit 620 passes a logic high value to input node 206DY regardless of the value of input signal 204D, logic circuit 630 passes a logic low value to input node 206DX regardless of the value of input signal 204D (e.g., AND gate of logic circuit 630 is disabled by selection signal 650), and logic circuit 640 passes input signal 204D to input node 206CX (e.g., multiplexer of logic circuit 640 ignores input signal 204C). This permits input signals 204A-C, 204EY, and 204F to be processed by LUT 502 to provide output signal 508A in response to such signals. This also permits input signals 204A-B, 204D, 204EX, and 204F to be processed by LUT 504 to provide output signal 508B in response to such signals.

Figure 7:
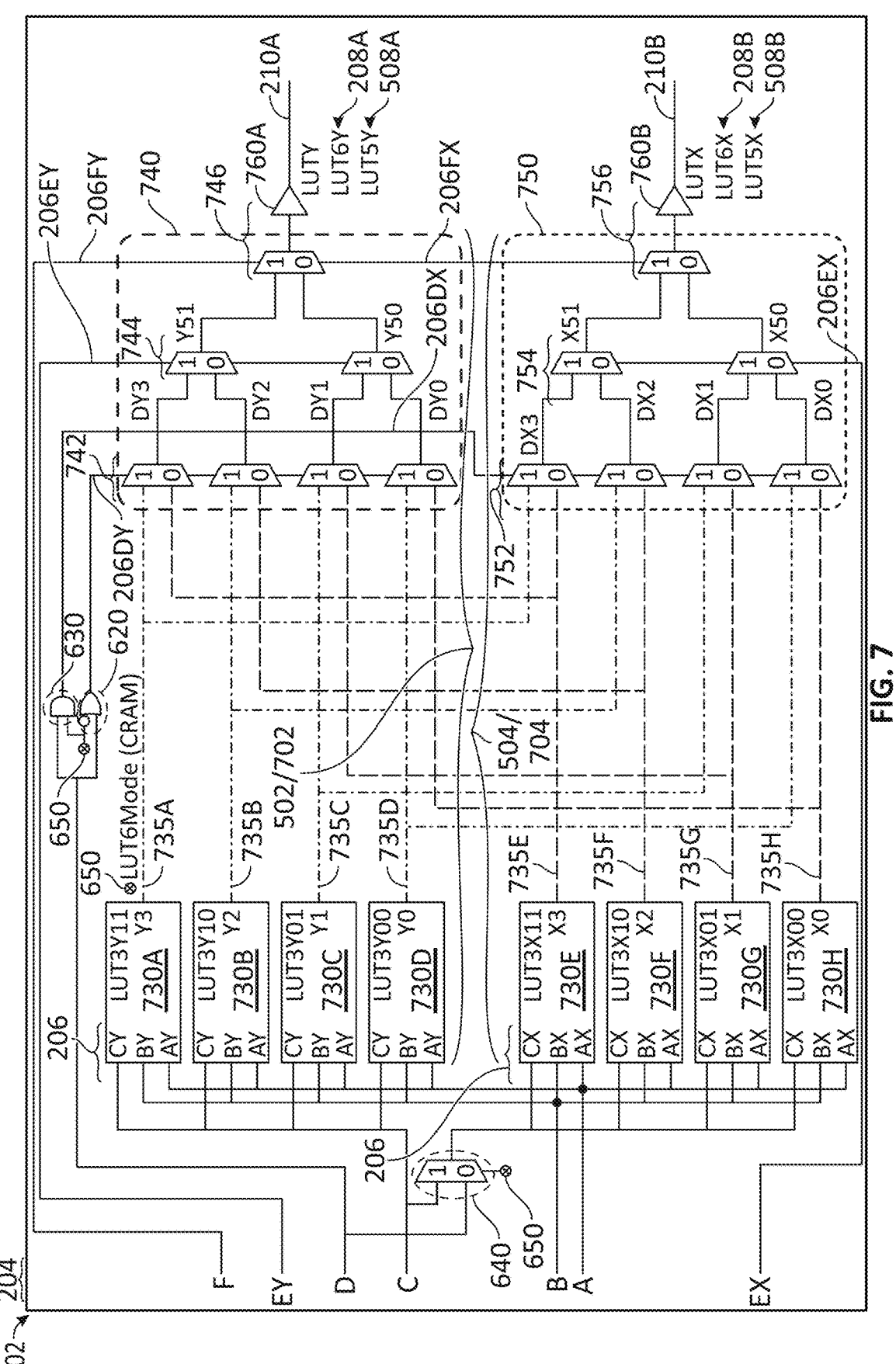
FIG. 7 illustrates a block diagram of a LUT with parallel multiplexer blocks illustrated in accordance with an embodiment of the disclosure.

FIG. 7 illustrates further implementation details of LUT 202 in accordance with an embodiment of the disclosure. LUT 202 receives input signals 204A-F and provides output signals 208A-B in response thereto for LUT6 mode or output signals 508A-B for LUT5 mode as previously discussed.

LUT 202 includes an upper circuit 702 that implements LUT 502 for LUT5 mode and a lower circuit 704 that implements LUT 504 for LUT5 mode. Upper circuit 702 and lower circuit 704 also operate together to implement LUT 202 for LUT6 mode.

Upper circuit 702 includes programmable logic circuits implemented as 3-input LUTs 730A-D that receive shared input signals 204A-C. Similarly, lower circuit 704 includes programmable logic circuits implemented as 3-input LUTs 730E-H that receive shared input signals 204A-C.

Upper circuit 702 includes a three stage multiplexer block 740 (e.g., including first stage 742, second stage 744, and third stage 746) that selectively passes signals from one of LUTs 730A-H to a buffer 760A and on to output node 210A. Lower circuit 704 includes a three stage multiplexer block 750 (e.g., including first stage 752, second stage 754, and third stage 756) that selectively passes signals from one of LUTs 730A-H to a buffer 760B and on to output node 210B. Advantageously, the implementation of parallel multiplexer blocks 740 and 750 in LUT 202 permits output nodes 210A and 210B to be swapped with each other by using the appropriate input signal 204EX or 204EY and input node 206EX or 206EY. The previously discussed input nodes 206AX-FX/206AY-FY, logic circuits 620, 630, and 640 and selection signal 650 are also illustrated in FIG. 7.

The operation of LUT 202 will be further discussed with regard to the block diagram of FIG. 7 and process 800 of FIG. 8. In operation 810, selection signal 650 (e.g., determined in operation 330 of FIG. 3 as discussed) determines whether LUT 202 is operated in a LUT6 mode or a LUT5 mode. If LUT6 mode is selected, the process continues to operations 815 to 840. If LUT5 mode is selected, the process continues to operations 850 to 875.

Referring now to LUT6 mode (operations 815 to 840), when selection signal 650 is set to a logic high value, logic circuit 640 passes input signal 204C in response to selection signal 650. Accordingly, in operation 815, input signals 204A-C are passed to and received by each of LUTs 730A-H at input nodes 206AX-CX and 206AY-CY. In operation 820, LUTs 730A-H provide corresponding intermediate signals 735A-H to first stages 742 and 752 of multiplexer blocks 740 and 750 in response to input signals 204A-C.

Continuing in LUT6 mode, first stage 742 is controlled by logic circuit 620 in response to input signal 204D and selection signal 650. While selection signal 650 is set to a logic high value, logic circuit 620 passes input signal 204D to the control inputs of the multiplexers in first stage 742 (input node 206DY). Accordingly, in operation 825, input signal 204D operates first stage 742 to select whether intermediate signals 735A-D of LUTs 730A-D or intermediate signals 735E-H of LUTs 730E-H are passed to second stage 744.

Continuing in LUT6 mode, first stage 752 is controlled by logic circuit 630 in response to input signal 204D and selection signal 650. While selection signal 650 is set to a logic high value, logic circuit 630 passes input signal 204D to the control inputs of the multiplexers in first stage 752 (input node 206DX). Accordingly, also in operation 825, input signal 204D operates to select whether intermediate signals 735A-D of LUTs 730A-D or intermediate signals 735E-H of LUTs 730E-H are passed to second stage 754.

Continuing in LUT6 mode, second stages 744 and 754 are controlled by input signals 204EY and 204EX that are passed to the control inputs of the multiplexers in second stages 744 and 754, respectively (input nodes 206EY and 206EX). Accordingly, in operation 830, input signals 204EY and 204EX operate to select among intermediate signals 735A-H of LUTs 730A-H that are passed by first stages 742 and 752.

Continuing in LUT6 mode, third stages 746 and 756 are controlled by input signal 204F that is passed to the control inputs of the multiplexers in third stages 746 and 756 (input nodes 206FY and 206FX). Accordingly, in operation 835, input signal 204F operates to select among intermediate signals 735A-H of LUTs 730A-H that are passed by second stages 744 and 754 to output nodes 210A and 210B to be provided as output signals 208A and 208B to routing resources 180 and/or registers 207 as discussed (operation 840).

Thus, it will be appreciated that output signal 208A provided at output node 210A for LUT6 mode is determined by input signals 204A-D, 204EY, and 204F. Similarly, output signal 208B provided at output node 210B for LUT6 mode is determined by input signals 204A-D, 204EX, and 204F.

It will also be appreciated that the implementation of parallel multiplexer blocks 740 and 750 discussed above permits output nodes 210A and 210B to be swapped with each other by using the appropriate input signal 204EX or 204EY and input node 206EX or 206EY. This permits LUT 202 to maintain such swappability while output nodes 210A and 210B are connected to routing resources 180 without requiring an additional intervening multiplexer stage.

As shown in FIG. 7, input signal 204F passes directly to third stages 746 and 756 of multiplexer blocks 740 and 750 without any intervening logic circuits. As a result, input signal 204F propagates faster through LUT 202 than the remaining input signals. Therefore, changing values of input signal 204F will affect the values of output signals 208A-B faster than the remaining input signals 204 (e.g., input signal 204F will exhibit the smallest propagation delay). This improves upon conventional LUTs that generally exhibit the same large propagation delays on all input signals which limits their achievable performance.

Referring now to LUT5 mode (operations 850 to 875), when selection signal 650 is set to a logic low value, logic circuit 640 passes input signal 204D in response to selection signal 650. Accordingly, in operation 850, input signals 204A-C are passed to and received by each of LUTs 730A-D at input nodes 206AY-CY, and input signals 204A-B and 204D are passed to and received by each of LUTs 730E-H at input nodes 206AX-CX. In operation 855, LUTs 730A-D provide corresponding intermediate signals 735A-D to first stage 742 of multiplexer block 740 in response to input signals 204A-C, and LUTs 730E-H provide corresponding intermediate signals 735E-H to first stage 752 of multiplexer block 750 in response to input signals 204A-B and 204D.

Continuing in LUT5 mode, in operation 860, while selection signal 650 is set to a logic low value, logic circuit 620 provides a logic high value to the control inputs of the multiplexers in first stage 742 (input node 206DY) regardless of the value of input signal 204D. Accordingly, also in operation 860, intermediate signals 735A-D of LUTs 730A-D are passed to second stage 744.

Continuing in LUT5 mode, also in operation 860, while selection signal 650 is set to a logic low value, logic circuit 630 provides a logic low value to the control inputs of the multiplexers in first stage 752 (input node 206DX) regardless of the value of input signal 204D. Accordingly, also in operation 860, intermediate signals 735E-H of LUTs 730E-H are passed to second stage 754.

Continuing in LUT5 mode, second stages 744 and 754 are controlled by input signals 204EY and 204EX that are passed to the control inputs of the multiplexers in second stages 744 and 754, respectively (input nodes 206EY and 206EX). Accordingly, in operation 865, input signals 204EY and 204EX operate to select among intermediate signals 735A-H of LUTs 730A-H that are passed by first stages 742 and 752.

Continuing in LUT5 mode, third stages 746 and 756 are controlled by input signal 204F that is passed to the control inputs of the multiplexers in third stages 746 and 756 (input nodes 206FY and 206FX). Accordingly, in operation 870, input signal 204F operates to select among intermediate signals 735A-H of LUTs 730A-H that are passed by second stages 744 and 754 to output nodes 210A and 210B to be provided as output signals 508A and 508B to routing resources 180 and/or registers 207 as discussed (operation 875).

Thus, it will be appreciated that output signal 508A provided at output node 210A for LUT5 mode is determined by input signals 204A-C, 204EY, and 204F. Similarly, output signal 508B provided at output node 210B for LUT5 mode is determined by input signals 204A-B, 204D, 204EX, and 204F.

As discussed, the implementation of parallel multiplexer blocks 740 and 750 permits output nodes 210A and 210B to be connected to routing resources 180 without requiring an additional intervening multiplexer stage. As a result, when LUT 202 is operated in fractured LUT5 mode as two LUT5s 502 and 504, the same benefit applies to output nodes 210A and 210B which will exhibit reduced propagation delay over conventional fracturable LUTs.

As discussed, input signal 204F passes directly to third stages 746 and 756 of multiplexer blocks 740 and 750 without any intervening logic circuits. As a result, input signal 204F propagates faster through LUT 202 than the remaining input signals, even when operated in LUT5 mode providing LUTs 502 and 504. Therefore, changing values of input signal 204F will affect the values of output signals 508A-B faster than the remaining input signals 204 (e.g., input signal 204F will exhibit the smallest propagation delay). This improves upon conventional fracturable LUTs that generally exhibit the same large propagation delays on all shared input signals which limits their achievable performance.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device (PLD), comprising:
   a multi-mode look-up table (LUT) comprising:
      a plurality of input nodes configured to receive a plurality of input signals;
      wherein the multi-mode LUT is configurable to selectively operate in a first mode as a single LUT or in a second mode as dual LUTs and generate a plurality of output signals in accordance with one or more logic functions in response to the input signals; and
      a plurality of output nodes configured to provide the plurality of output signals simultaneously to routing resources of the PLD without an output multiplexer positioned between the dual LUTs and the routing resources.

2. The PLD of claim 1, wherein:
   the multi-mode LUT is configured to provide the output signals in accordance with a first logic function in the first mode; and
   the multi-mode LUT is configured to provide the output signals in accordance with second and third logic functions in the second mode.

3. The PLD of claim 1, wherein the first and second output nodes are swappable with each other without requiring an output multiplexer positioned between the output nodes and the routing resources in the first mode.

4. The PLD of claim 3, wherein the first and second output nodes are swappable with each other by adjusting two of the input signals.

5. The PLD of claim 1, wherein the multi-mode LUT comprises:
   a plurality of programmable logic circuits configured to provide intermediate signals in response to the input signals; and
   first and second parallel multiplexer blocks each configured to selectively route the intermediate signals to corresponding ones of the output nodes to provide the output signals.

6. The PLD of claim 5, wherein the programmable logic circuits are LUTs each receiving a first subset of the input signals and each providing a corresponding one of the intermediate signals.

7. The PLD of claim 5, wherein the first and second parallel multiplexer blocks are configured to route the intermediate signals in response to a second subset of the input signals and a selection signal.

8. The PLD of claim 5, wherein the first and second parallel multiplexer blocks each comprise a series of multiplexer stages.

9. The PLD of claim 1, wherein a first one of the input signals exhibits a reduced propagation delay through the multi-mode LUT in relation to the other input signals.

10. The PLD of claim 1, wherein:

the multi-mode LUT provides each of the output signals directly to the routing resources in response to six of the input signals in the first mode;

the multi-mode LUT provides each of the output signals directly to the routing resources in response to five of the input signals in the second mode; and the PLD further comprises the routing resources.

11. A method comprising:

receiving a plurality of input signals at a plurality of input nodes of a multi-mode look-up table (LUT) of a programmable logic device (PLD);

selectively operating the multi-mode LUT in a first mode as a single LUT or a second mode as dual LUTs to generate output signals in accordance with one or more logic functions in response to the input signals;

providing the output signals from corresponding output nodes of the PLD simultaneously to routing resources of the PLD without an output multiplexer positioned between the dual LUTs and the routing resources.

12. The method of claim 11, wherein:

the providing comprises providing the output signals in accordance with a first logic function in the first mode; and the providing comprises providing the output signals in accordance with second and third logic functions in the second mode.

13. The method of claim 11, further comprising swapping the first and second output nodes without requiring an output multiplexer positioned between the output nodes and the routing resources in the first mode.

14. The method of claim 13, wherein the swapping comprises adjusting two of the input signals.

15. The method of claim 11, wherein the operating comprises:

operating a plurality of programmable logic circuits to provide intermediate signals in response to the input signals; and operating first and second parallel multiplexer blocks to selectively route the intermediate signals to corresponding ones of the output nodes to provide the output signals.

16. The method of claim 15, wherein the programmable logic circuits are LUTs each receiving a first subset of the input signals and each providing a corresponding one of the intermediate signals.

17. The method of claim 15, wherein the first and second parallel multiplexer blocks route the intermediate signals in response to a second subset of the input signals and a selection signal.

18. The method of claim 15, wherein the first and second parallel multiplexer blocks each comprise a series of multiplexer stages.

19. The method of claim 11, wherein a first one of the input signals exhibits a reduced propagation delay through the multi-mode LUT in relation to the other input signals.

20. The method of claim 11, wherein:

the operating comprises:

generating the output signals in response to six of the input signals in the first mode, and generating the output signals in response to five of the input signals in the second mode;

the providing comprises providing each of the output signals directly to the routing resources; and the PLD further comprises the routing resources.

* * * * *